United States Patent
Mu et al.

(10) Patent No.: US 8,713,406 B2
(45) Date of Patent: Apr. 29, 2014

(54) ERASING A NON-VOLATILE MEMORY (NVM) SYSTEM HAVING ERROR CORRECTION CODE (ECC)

(75) Inventors: Fuchen Mu, Austin, TX (US); Frank K. Baker, Jr., Austin, TX (US); Chen He, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 106 days.

(21) Appl. No.: 13/459,344

(22) Filed: Apr. 30, 2012

(65) Prior Publication Data

US 2013/0290808 A1    Oct. 31, 2013

(51) Int. Cl.
*G11C 29/00*    (2006.01)

(52) U.S. Cl.
USPC ..................... 714/764; 365/185.22

(58) Field of Classification Search
USPC ........... 365/185.19, 185.29, 185.22; 714/721, 714/718, 763, 768, 764
See application file for complete search history.

(56) References Cited

U.S. PATENT DOCUMENTS

| | | | | |
|---|---|---|---|---|
| 5,579,262 A * | 11/1996 | Song | ........................ | 365/185.22 |
| 5,995,417 A * | 11/1999 | Chen et al. | ............... | 365/185.29 |
| 6,967,873 B2 | 11/2005 | Hamilton et al. | | |
| 7,400,537 B2 * | 7/2008 | Hemink et al. | .......... | 365/185.29 |
| 7,808,829 B2 | 10/2010 | Lee | | |
| 8,064,267 B2 * | 11/2011 | Sarin et al. | ............... | 365/185.29 |
| 8,391,080 B2 * | 3/2013 | Sarin et al. | ............... | 365/185.29 |
| 2006/0133141 A1 | 6/2006 | Gorobets | | |
| 2008/0089135 A1 * | 4/2008 | Ito | ............................ | 365/185.29 |
| 2009/0168544 A1 * | 7/2009 | Jeon | ......................... | 365/185.29 |
| 2012/0201082 A1 * | 8/2012 | Choy et al. | ............... | 365/185.19 |

FOREIGN PATENT DOCUMENTS

EP    1703522 A1    9/2006

* cited by examiner

*Primary Examiner* — David Ton
(74) *Attorney, Agent, or Firm* — James L. Clingan, Jr.; Mary Jo Bertani

(57) ABSTRACT

A method of erasing a non-volatile semiconductor memory device comprising determining a number of bit cells that failed to erase verify during an erase operation. The bit cells are included in a subset of bit cells in an array of bit cells. The method further comprises determining whether an Error Correction Code (ECC) correction has been previously performed for the subset of bit cells. The erase operation is considered successful if the number of bit cells that failed to erase verify after a predetermined number of erase pulses is below a threshold number and the ECC correction has not been performed for the subset of bit cells.

20 Claims, 3 Drawing Sheets

ERASING A NON-VOLATILE MEMORY (NVM) SYSTEM HAVING ERROR CORRECTION CODE (ECC)

BACKGROUND

1. Field

This disclosure relates generally to non-volatile memories (NVM), and more specifically, to NVM systems with error correction code (ECC).

2. Related Art

Non-volatile memories (NVMs) generally require special operations for program and erase and there is a limit to how many times these operations can be performed. Also a common memory type, flash, is erased in blocks. Thus memory cells that have been erased successfully may continue to be subjected to erase conditions while other memory cells are still being erased. These bits that are slow to erase may be referenced as slow bit. Some memory cells may be over-erased that then must be soft programmed to overcome the problems associated with over-erase such as excessive leakage as part of the embedded erase operation. Soft programming typically takes a relatively long time since it is done per address and with low bias. With more cells required to be soft programmed, it may eventually cause the embedded erase operation to fail to complete within the specified maximum time. Another issue that over time and perhaps tens of thousands of cycles, and even memory cells become weak or slow to erase. These latent weak memory cells are very difficult to detect until they actually become weak or slow to erase. Thus, it is not uncommon for them to occur well after the device has been placed in a product which may cause product failure. Product failure is very desirable to avoid under any circumstances but especially failure of an integrated circuit. This is not generally something that the user of the product can repair but the product must be returned and someone with special training and expensive equipment must do the repair assuming the repair is even worth doing in light of the cost of repair relative to the cost of the product.

Accordingly, there is a need for NVM systems to improve upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, error correction code (ECC) is used in conjunction with a non-volatile memory (NVM) to optimize the erase operation. Especially after usage for quite some time, an erase operation may be hindered by a single bit that is slow to erase. When the single bit is significantly far from being erased, it may be predictable that it is unlikely to ever be successfully erased. In such case ECC may be relied upon to correct this single bit failure. On the other hand if the single bit is relatively close to being successfully erased, the erase process can continue with a high degree of confidence that it will be successfully erased. This is better understood by reference to the drawings and the following written description.

Figure 1:
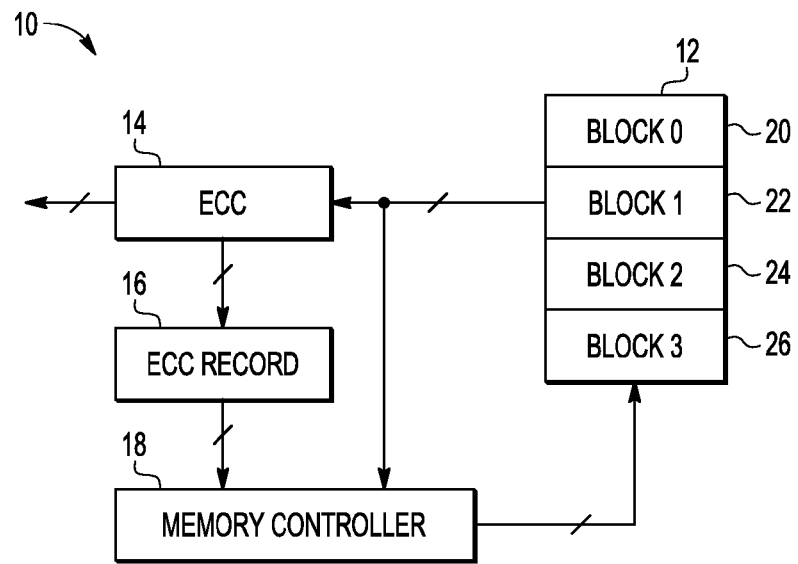
FIG. 1 is an NVM system according to an embodiment.

Shown in FIG. 1 is a non-volatile memory (NVM) system 10 having an NVM array 12, an error correction code (ECC) unit 14, an ECC record 16, and a memory controller 18. NVM array 12 includes a plurality of blocks including a block 20 that is shown as block 0, a block 22 that is shown block 1, a block 24 that is shown as block 2, and a block 26 that is shown as block 3. Memory controller 18 is coupled to NVM array 12 and ECC record 16. ECC unit 14 is coupled to NVM array 12 and ECC record 16. Blocks 20, 22, 24, and 26 each have a plurality of memory cells. For a given block of blocks 20, 22, 24, and 26, all of the memory cells are erased at the same time. This is typical of NVMs that are flash memories in that the erase operation is by block.

Memory controller 18 controls the operation of NVM array 12 such as controlling the block erase operations, reading, and programming. ECC unit 14 receives the output of NVM array 12, corrects errors, and provides a corrected output. ECC unit 14 also provides information to ECC record 16 as to which locations in NVM array needed correcting and information about those corrections. ECC record 16 is preferably non-volatile memory and may be in a reserved portion of NVM array 12. Memory controller 18 has access to the information stored in ECC record 16.

Figure 2:
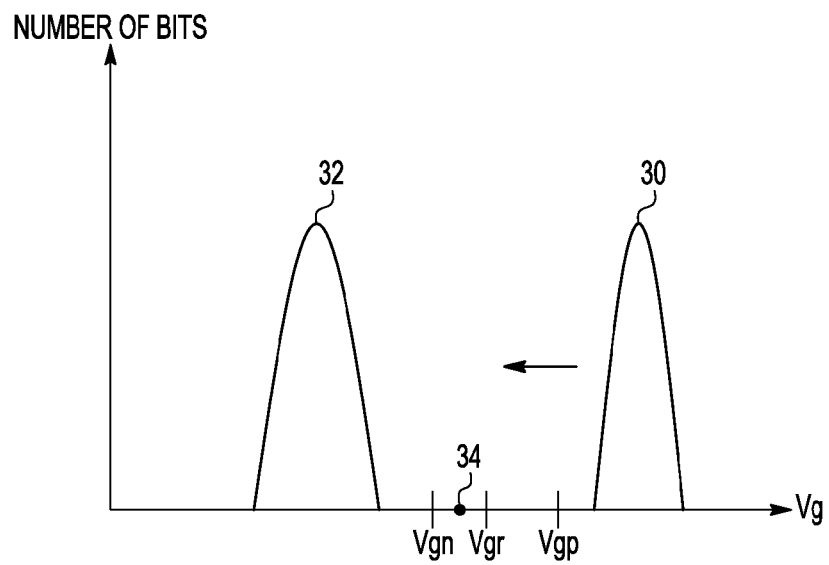
FIG. 2 is a diagram helpful in understanding the NVM system of FIG. 1.

Shown In FIG. 2 is a gate voltage distribution 30 of bits before an erase operation of one of blocks 20, 22, 24, and 26 and a distribution 32 of bits after a portion of the erase operation. Distribution 30 arises from a first part of the overall erase process by which all of the bits of a block are first brought to a programmed state. The distribution is desirably tight. The erase operation is performed as pluralities of erase pulses to lower a threshold voltage of all of the bits of the block being erased to a sufficiently low threshold voltage so that the gate voltage Vg at which they conduct a specified current is below the normal erase verify level which is referenced as normal erase verify Vgn. So a first step is applying a first group of consecutive erase pulse. After the first step, the bit cells are tested to verify that they have been properly erased by which the gate voltage Vg for conducting the specified current is below normal erase verify Vgn. This testing of the bit cells may be referenced as a verify. If more erasing is required, subsequent steps of applying pulses are performed. The subsequent steps may have the same number of pulses for the same duration and at the same voltage. On the other hand, the subsequent erase steps can be the same or different as to the number of pulses, the time duration, and the voltage. Distribution 32 is considered erased because all of the bits have a threshold voltage that results in the gate voltage Vg at which the specified current is conducted is below erase verify voltage Vgn. The bits of distribution 32 may thus be referenced as being below erase verify voltage Vgn. Distribution 30 is considered programmed because all of the bits have a threshold voltage that results in the gate voltage at which the specified current being conducted exceeds a program verify voltage Vgp. The bit of distribution 30 can thus be referenced as being above program verify voltage Vgp. The gate voltage Vg that is applied to the bit cells during a read that is performed during normal operation of NVM system 10 is between erase verify voltage Vgn and program verify voltage Vgp and is chosen based upon the optimum for performing a read that distinguishes between the programmed and erased states of the bits as well as ensure sufficient margin for data retention. That is to say, the erased bits should be in a state in which the current should be above a predetermined current by some margin when the gate voltage Vg is applied as the read voltage during normal operation and the programmed bits should provide a current below the predetermined current by some margin when the gate voltage Vg is applied as the read voltage for normal operation.

As shown in FIG. 2, there is a also a bit 34 that is not below voltage Vgn arising from the first step in the erase operation and thus is not sufficiently erased for testing based upon applying erase verify voltage Vgn as the gate voltage Vg. Another verify is performed with the applied gate voltage of a raised voltage of Vgr which is higher than erase verify voltage Vgn by a predetermined difference which may be 300 millivolts. This is an easier test in that bits with a higher threshold voltage can conduct the specified current because of the raised voltage Vgr being applied as the gate voltage Vg. Using raised voltage Vgr as the gate voltage Vg may be referenced as a relaxed erase verify. As shown in FIG. 2, bit 34 passes the relaxed verify.

Figure 3:
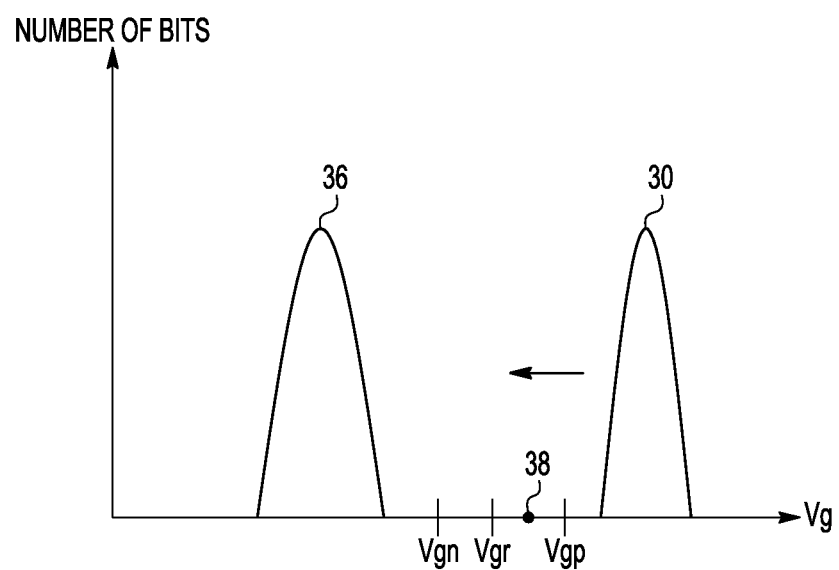
FIG. 3 is a diagram helpful in understanding the NVM system of FIG. 1.

Shown in FIG. 3 is for the case where distribution 30 is has a first step of an erase operation performed to result in a distribution 36 similar to distribution 32 of FIG. 2 and has a bit 38 that does not pass the erase test based on voltage Vgn. The difference is that the single bit that does not pass the test, also does not pass the relaxed test of applying voltage Vgr. Thus, in this case, the only bit, bit 38, that does not pass the relaxed verify after the first erase steps can be expected to require more further erasing than will be required to erase bit 34 in FIG. 2.

Figure 4:
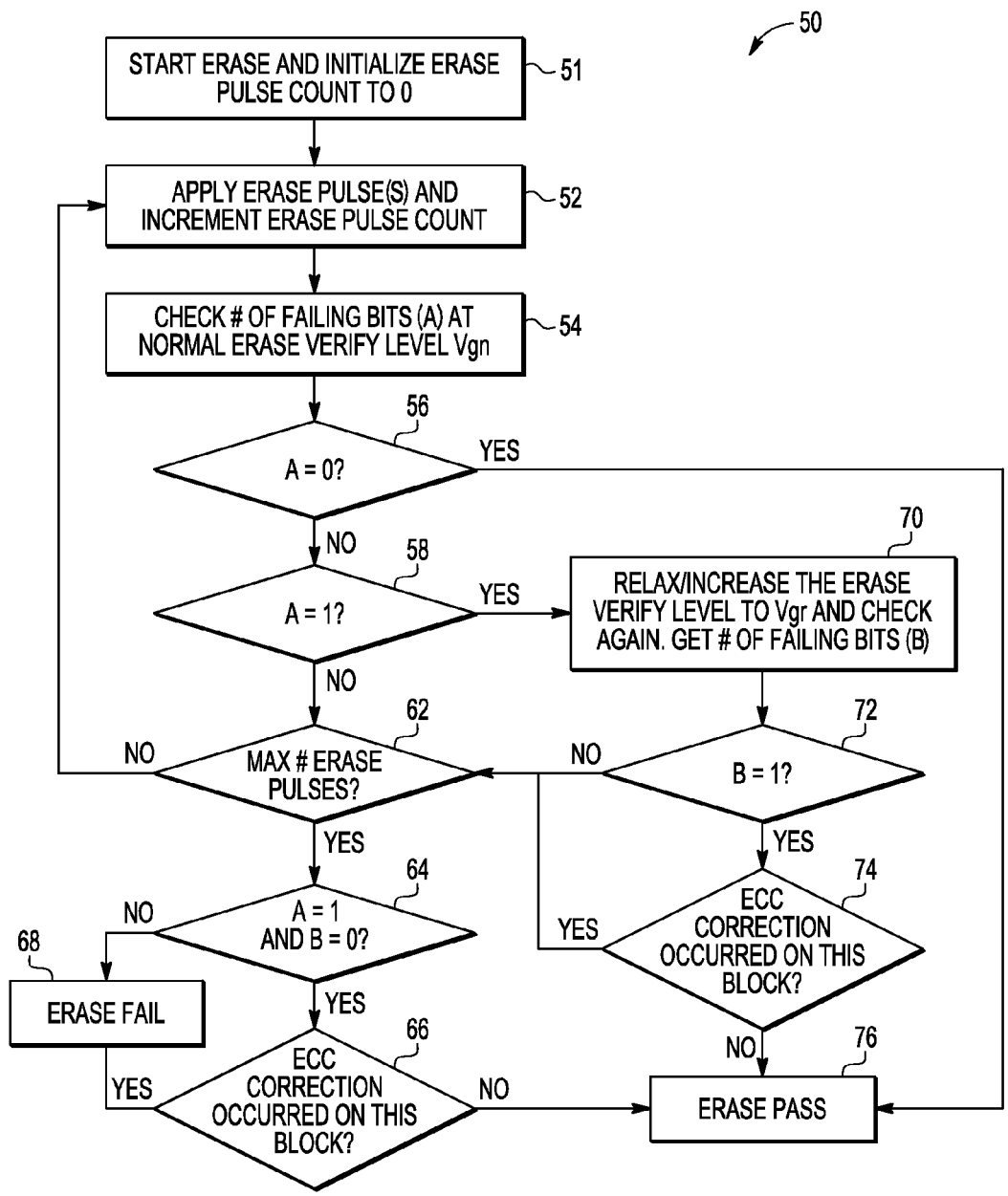
FIG. 4 is a flow chart helpful in understanding the NVM system of FIG. 1

Shown in FIG. 4 is a flow diagram 50 that shows how to address the situations of FIGS. 2 and 3. Flow diagram 50 includes steps 51, 52, 54, 56, 58, 62, 64, 66, 68, 70, 72, 74, and 76. At step 51, erase operation starts and an erase pulse count is initialized to zero. Step 52 is applying the erase pulse or pulses for a single step of an erase operation of one of blocks 20, 22, 24, and 26 and incrementing the erase pulse count. At step 54, a verify is performed to determine the number of failing bits at the normal verify level of Vgn. The number of failing bits is shown as "A" in FIG. 4. A determination at step 56 is made if the number of failing bits is zero. If the answer is yes, then the process concludes with a step 76 with the erase being passed. The process can continue with soft programming as needed. Soft programming is to tighten the distribution of the erased bits and can be very important in reducing leakage current in bits that were over-erased. If the answer is no at step 56, a determination is made at step 58 if the number of failed bits tested at voltage Vgn is 1. If the answer is no, then that means there are two or more failed bits. With two or more failed bits, there is a determination at step 62 if the maximum number of erase pulses has been reached. Typically there is a limit of the number of erase pulses that is considered the maximum number. If that number has not been reached, then the next step is to perform another erase step by applying an erase pulse or pulses and then continuing as before with step 54. If the number of failed bits using voltage Vgn is one, then the erase verify level is relaxed, which is an increase to Vgr, and verify is performed again at step 70 to determine the number of failing bits. The number of failing bits at Vgr is "B" as shown in FIG. 4. If the number of failing bits using Vgr is one as checked at step 72, then ECC record 16 is checked to determine if ECC correction has previously occurred for this block as shown in step 74. If ECC has not performed a correction for this block, then erase passes as shown in step 76. This conclusion is based on the knowledge that ECC can be used to correct any error caused by this single failed bit that is relatively far from being erased. This saves a number of erase steps that can put the block through additional erase pulses impacting endurance and causing more bits to become over-erased.

If, in step 74, it is determined that ECC correction has occurred in the block being erased, the next step is determine if the maximum number of erase pulses has occurred as shown in step 62. If no, then the next step is to continue with another erase step applying an erase pulse or pulses. If the maximum number of erase pulses has been reached as determined in step 62, then the erase fails as shown in step 68. In this case, there has already been a determination that there has been a failure using Vgr so B does not equal zero, thus the question shown as step 64 has been answered as no. For the case where step 72 determines that the number of bits that fail the relaxed test is zero, step 62 is in effect to determine if the maximum number of pulses has been reached in step 62. If no, then the process continues with more erase pulses of step 52. In this case there is an expectation that the failed bit between Vgn and Vgr will pass with more erase pulses. If the maximum number of erase pulses has been reached as determined in step 62, then there is a determination in step 64 if the number of failing bits at Vgn is one and that the one failing bit passes the relaxed test of Vgr, which is A=1 and B=0 as shown in step 66. If so, then ECC record 16 is checked by memory controller 18 to determine if the block being erased has had corrections using ECC unit 14. If not, then the erase passes as shown in step 76. If in step 66 it is determined that ECC correction has been required on this block being erased, then the next step is that the erase has failed as shown in step 68.

Taking advantage of available ECC correction capability can be based not just whether ECC corrections have already been found necessary on a block level but also on where the defective bit is located within a given architecture. For example, the ECC may be providing corrections on a segment basis where a segment is a 64 bit double word. ECC resources may be dedicated on a segment basis. In such case if the failing bit is in a segment that has not previously required ECC corrections, that failing bit can still be considered to have passed the erase because ECC correction is still available in the segment where the failing bit is located. In such case it is even possible that two failing bits can pass erase so long as they are located in different segments. Thus, for example, step 74 in FIG. 4, can be a check to see if the ECC correction has been required for the segment where the failing bit is located. If not, then the ECC correction is still fully available for the failing bit. Thus potential exists to rely on ECC correction for up to as many failing bits as the number of segments in the block being erased so long as no two failing bits are in the same segment. In such case ECC record would contain the information as to which segments had required ECC correction. Thus, the determination as to whether the failed bit or bits would be determined on a segment basis rather than a block basis.

Thus, a memory block has been through an erase operation that takes advantage of knowing the most likely situation of a single failed bit and taking advantage of the available ECC. If the ECC is not to be otherwise required and there is a single slow bit during erase, then the ECC can be relied upon to handle the situation. If the single slow bit is close to passing, then erasing may continued with the expectation that it will ultimately pass. If the single slow bit is far from passing, then there is not likely to be a success in continuing the erase process so the subsequent erase steps need not be performed if the ECC can be relied upon with a very high degree of confidence to correct the error.

Another approach is to not perform the ECC check during erase verify, but consider the erase operation successful if only one bit fails at normal erase verify level and only one bit fails at the relaxed erase verify level, or only one bit fails at normal erase verify level but the number of erase pulse count reaches the maximum erase pulse count limit. ECC would still be performed during normal operation to correct the failed bit.

By now it should be appreciated that there has been provided a semiconductor memory storage device that has an array of non-volatile memory (NVM) bit cells, wherein the array of NVM bit cells is partitioned in one or more blocks. The semiconductor memory storage device further includes a memory controller coupled to the array of NVM bit cells and an error correction code (ECC) unit coupled to the array and the memory controller. The memory controller is configured to, during an erase operation on one of the one or more blocks, when a first verify operation detects only one of the NVM bit cells fails to erase verify at a normal erase verify voltage level, and when a second verify operation detects one of the NVM bit cells fails to erase verify at a relaxed erase verify voltage level, wherein the relaxed erase verify voltage level is higher than the normal erase verify voltage level, consider the erase operation to be successful. The semiconductor memory storage device may have a further characterization by which the erase operation is considered to be successful if the ECC unit did not previously perform a correction on the block that is being erased. The semiconductor memory storage device may have a further characterization by which during the erase operation, the first and second verify operations are performed after each erase pulse or group of erase pulses. The semiconductor memory storage device may have a further characterization by which the erase operation is considered to be successful if the ECC unit did not previously perform a correction on an ECC segment that includes the one of the NVM bit cells that failed to erase verify at the relaxed erase verify voltage level. The semiconductor memory storage device may have a further characterization by which the memory controller is configured to, during the erase operation on the one of the blocks, when the first verify operation detects only one of the NVM bit cells fails to erase verify at the normal erase verify voltage level and the second verify operation detects all of the NVM bit cells successfully erased at the relaxed erase verify voltage level, consider the erase operation to be successful if a maximum number of erase pulses is reached. The semiconductor memory storage device may have a further characterization by which the erase operation is considered to be successful by the memory controller if the ECC unit did not previously perform a correction on an ECC segment that includes the one of the NVM bit cells that failed to erase verify at the normal erase verify voltage level. The semiconductor memory storage device may have a further characterization by which the erase operation is considered to be successful if the ECC unit did not previously perform a correction on the one of the blocks that includes the one of the NVM bit cells that failed to erase verify at the normal erase verify voltage level. The semiconductor memory storage device may have a further characterization by which a predetermined number of erase pulses are performed by the memory controller before counting a number of NVM bit cells that failed the first verify operation. The semiconductor memory storage device may have a further characterization by which the predetermined number of erase pulses is between 5 and 10 erase pulses. The semiconductor memory storage device may further include an ECC record containing one or more ECC indicators stored in non-volatile memory, wherein each of the ECC indicators is allocated to a corresponding one of the blocks of NVM bit cells and indicates whether an ECC correction has been performed on the corresponding block. The semiconductor memory storage device may further include an ECC record containing one or more ECC indicators stored in non-volatile memory, wherein each of the ECC indicators is allocated to a corresponding ECC segment of the NVM bit cells and indicates whether an ECC correction has been performed on the corresponding ECC segment.

Disclosed also is a method of erasing a semiconductor memory device. The method includes performing an erase operation on a subset of an array of non-volatile bit cells. The method further includes, if during the erase operation a first erase verify operation detects only one of the non-volatile bit cells fails to erase verify at a normal erase verify voltage level and a second verify operation detects all of the non-volatile bit cells successfully erase at a relaxed erase verify voltage level, wherein the relaxed erase verify voltage level is higher than the normal erase verify voltage level, designating the erase operation as successful if a maximum number of erase pulses is reached. The method may have a further characterization by which, during the erase operation, when the first erase verify operation detects that only one of the non-volatile bit cells fails to erase verify at the normal erase verify voltage level and the second erase verify operation detects that one of the non-volatile bit cells fails to erase verify at the relaxed erase verify voltage level, designating the erase operation as successful. The method may further include designating the erase operation as successful if an Error Correction Code (ECC) correction was not previously performed on the subset of non-volatile bit cells that is being erased. The method may have a further characterization by which the erase operation is considered to be successful if the ECC unit did not previously perform a correction on an ECC segment that includes the one of the non-volatile bit cells that failed to erase verify at the relaxed erase verify voltage level. The method may have a further characterization by which, during the erase operation, the first and second verify operations are performed after each erase pulse or group of erase pulses. The method may further include designating the erase operation as successful if an Error Correction Code (ECC) correction was not previously performed on an ECC segment of the subset of the non-volatile bit cells that includes the bit cell that failed to erase verify at the normal erase verify voltage level. The method may further include designating the erase operation as successful if an Error Correction Code (ECC) unit did not previously perform a correction on the subset of the array that includes the one of the non-volatile bit cells that failed to erase verify at the normal erase verify voltage level.

Disclosed also is a method of erasing a non-volatile semiconductor memory device. The method includes determining a number of bit cells that failed to erase verify during an erase operation, wherein the bit cells are included in a subset of bit cells in an array of bit cells. The method further includes determining whether an Error Correction Code (ECC) correction has been previously performed for the subset of bit cells. The method further includes allowing the erase operation to be considered successful if the number of bit cells that failed to erase verify after a predetermined number of erase pulses is below a threshold number and the ECC correction has not been performed for the subset of bit cells. The method may further include, during the erase operation on the subset of the bit cells, when the first verify operation detects the predetermined number of the bit cells fails to erase verify at the normal erase verify voltage level and when the second verify operation detects the predetermined number of the bit cells fails to erase verify at the relaxed erase verify voltage level, designating the erase operation as successful.

Although the invention is described herein with reference to specific embodiments, various modifications and changes can be made without departing from the scope of the present invention as set forth in the claims below. For example, the number of blocks per array can vary. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor memory storage device, comprising:
    an array of non-volatile memory (NVM) bit cells, wherein the array of NVM bit cells is partitioned in one or more blocks;
    a memory controller coupled to the array of NVM bit cells; and
    an error correction code (ECC) unit coupled to the array and the memory controller, wherein the memory controller is configured to:
        during an erase operation on one of the one or more blocks,
            when a first verify operation detects only one of the NVM bit cells fails to erase verify at a normal erase verify voltage level, and
            when a second verify operation detects one of the NVM bit cells fails to erase verify at a relaxed erase verify voltage level, wherein the relaxed erase verify voltage level is higher than the normal erase verify voltage level, consider the erase operation to be successful.

2. The semiconductor memory storage device of claim 1, wherein the erase operation is considered to be successful if the ECC unit did not previously perform a correction on the block that is being erased.

3. The semiconductor memory storage device of claim 1, wherein during the erase operation, the first and second verify operations are performed after each erase pulse or group of erase pulses.

4. The semiconductor memory storage device of claim 1, wherein the erase operation is considered to be successful if the ECC unit did not previously perform a correction on an ECC segment that includes the one of the NVM bit cells that failed to erase verify at the relaxed erase verify voltage level.

5. The semiconductor memory storage device of claim 1, wherein the memory controller is configured to, during the erase operation on the one of the blocks, when the first verify operation detects only one of the NVM bit cells fails to erase verify at the normal erase verify voltage level and the second verify operation detects all of the NVM bit cells successfully erased at the relaxed erase verify voltage level, consider the erase operation to be successful if a maximum number of erase pulses is reached.

6. The semiconductor memory storage device of claim 5, wherein the erase operation is considered to be successful by the memory controller if the ECC unit did not previously perform a correction on an ECC segment that includes the one of the NVM bit cells that failed to erase verify at the normal erase verify voltage level.

7. The semiconductor memory storage device of claim 5, wherein the erase operation is considered to be successful if the ECC unit did not previously perform a correction on the one of the blocks that includes the one of the NVM bit cells that failed to erase verify at the normal erase verify voltage level.

8. The semiconductor memory storage device of claim 1, wherein a predetermined number of erase pulses are performed by the memory controller before counting a number of NVM bit cells that failed the first verify operation.

9. The semiconductor memory storage device of claim 8, wherein the predetermined number of erase pulses is between 5 and 10 erase pulses.

10. The semiconductor memory storage device of claim 1, further comprising an ECC record containing one or more ECC indicators stored in non-volatile memory, wherein each of the ECC indicators is allocated to a corresponding one of the blocks of NVM bit cells and indicates whether an ECC correction has been performed on the corresponding block.

11. The semiconductor memory storage device of claim 1, further comprising an ECC record containing one or more ECC indicators stored in non-volatile memory, wherein each of the ECC indicators is allocated to a corresponding ECC segment of the NVM bit cells and indicates whether an ECC correction has been performed on the corresponding ECC segment.

12. A method of erasing a semiconductor memory device comprising:
    performing an erase operation on a subset of an array of non-volatile bit cells, and
    if during the erase operation a first erase verify operation detects only one of the non-volatile bit cells fails to erase verify at a normal erase verify voltage level and a second verify operation detects all of the non-volatile bit cells successfully erase at a relaxed erase verify voltage level, wherein the relaxed erase verify voltage level is higher than the normal erase verify voltage level, designating the erase operation as successful if a maximum number of erase pulses is reached.

13. The method of claim 12 further comprising:
    during the erase operation, when the first erase verify operation detects that only one of the non-volatile bit cells fails to erase verify at the normal erase verify voltage level,
        when the second erase verify operation detects that one of the non-volatile bit cells fails to erase verify at the relaxed erase verify voltage level, designating the erase operation as successful.

14. The method of claim 12, further comprising designating the erase operation as successful if an Error Correction Code (ECC) correction was not previously performed on the subset of non-volatile bit cells that is being erased.

15. The method of claim 12, wherein the erase operation is considered to be successful if the ECC unit did not previously perform a correction on an ECC segment that includes the one of the non-volatile bit cells that failed to erase verify at the relaxed erase verify voltage level.

16. The method of claim 13, wherein during the erase operation, the first and second verify operations are performed after each erase pulse or group of erase pulses.

17. The method of claim 13, further comprising designating the erase operation as successful if an Error Correction Code (ECC) correction was not previously performed on an ECC segment of the subset of the non-volatile bit cells that includes the bit cell that failed to erase verify at the normal erase verify voltage level.

18. The method of claim 13, further comprising designating the erase operation as successful if an Error Correction Code (ECC) unit did not previously perform a correction on the subset of the array that includes the one of the non-volatile bit cells that failed to erase verify at the normal erase verify voltage level.

19. A method of erasing a non-volatile semiconductor memory device comprising:
   determining a number of bit cells that failed to erase verify during an erase operation, wherein the bit cells are included in a subset of bit cells in an array of bit cells;
   determining whether an Error Correction Code (ECC) correction has been previously performed for the subset of bit cells; and
   allowing the erase operation to be considered successful if the number of bit cells that failed to erase verify after a predetermined number of erase pulses is below a threshold number and the ECC correction has not been performed for the subset of bit cells.

20. The method of claim 19, further comprising:
   during the erase operation on the subset of the bit cells, when the first verify operation detects the predetermined number of the bit cells fails to erase verify at the normal erase verify voltage level,
      when the second verify operation detects the predetermined number of the bit cells fails to erase verify at the relaxed erase verify voltage level,
      designating the erase operation as successful.

* * * * *